United States Patent [19]

Perfecto et al.

[11] Patent Number: 5,534,466
[45] Date of Patent: Jul. 9, 1996

[54] METHOD OF MAKING AREA DIRECT TRANSFER MULTILAYER THIN FILM STRUCTURE

[75] Inventors: Eric D. Perfecto, Poughkeepsie; Chandrika Prasad, Wappingers Falls, both of N.Y.; George E. White, Hoffman Estates, Ill.; Kwong H. Wong, Wappingers Falls, N.Y.

[73] Assignee: International Business Machines Corporation, Armonk, N.Y.

[21] Appl. No.: 457,191

[22] Filed: Jun. 1, 1995

[51] Int. Cl.⁶ .................................................. H01L 21/18
[52] U.S. Cl. ........................... 437/208; 437/187; 437/944; 437/974; 156/631.1
[58] Field of Search ............................ 437/208, 944, 437/189, 183, 974, 86; 156/236, 630.1, 631.1

[56] References Cited

U.S. PATENT DOCUMENTS

| | | | |
|---|---|---|---|
| 4,480,288 | 10/1984 | Gazdik et al. | 361/398 |
| 4,743,568 | 5/1988 | Wood | 437/189 |
| 4,769,108 | 9/1988 | Deppe et al. | 156/631.1 |
| 4,950,527 | 8/1990 | Yamada | 428/192 |
| 5,256,562 | 10/1993 | Vu et al. | 437/208 |
| 5,258,236 | 11/1993 | Arjdvolinyan et al. | 428/626 |
| 5,274,912 | 1/1994 | Olenick et al. | 29/830 |
| 5,286,335 | 2/1994 | Drabik et al. | 156/631.1 |
| 5,329,695 | 7/1994 | Traskos et al. | 29/830 |
| 5,366,573 | 11/1994 | Bayer et al. | 156/236 |
| 5,455,202 | 10/1995 | Malloy et al. | 437/944 |
| 5,459,081 | 10/1995 | Kojito | 437/974 |

OTHER PUBLICATIONS

Kenneth Mason Publications Ltd, England, Number 292, Aug. 1988, "Process for Manufacturing Polymer Film for Use as a Printed Circuit Substrate (Decal–On–Glass)", Skarvinko et al.

IBM Technical Disclosure Bulletin, vol. 21, No. 5, Oct. 1978 "Transferable PC System", W. R. Pratt.

IBM Technical Disclosure Bulletin, vol. 27, No. 3, Aug. 1984, "Process for Transferring Thin–Film Conductor Patterns to a Multilayer Ceramic Substrate for Semiconductor Chips", G. Kraus, et al, pp. 1404–1405.

IBM Technical Disclosure Bulletin, vol. 32, No. 53, Oct. 1989, "Simplified Transferable Metallurgy Pattern with High Capability", L. H. Wirtz, et al.

*Primary Examiner*—George Fourson
*Assistant Examiner*—Thomas G. Bilodeau
*Attorney, Agent, or Firm*—Peter W. Peterson; DeLio & Peterson; Aziz M. Ahsan

[57] ABSTRACT

A process for transferring a thin film wiring layer to a substrate in the construction of multilayer chip modules initially provides a sacrificial release layer formed on a surface of a carrier. Directly on the release layer there is formed in inverted fashion a plurality of multilevel thin film structures having at least one wiring path of metallic material exposed on the surface opposite the carrier. An electronic packaging substrate is provided, and solder or other joining material is applied to one or both of the exposed metallic surface of the multilevel thin film structure or the substrate. The multilevel thin film structure is then joined to the substrate so that the attached carrier is remote from the substrate. The release layer is subsequently contacted with an etchant for the release layer so as to remove the carrier from the multilevel thin film structure to produce a multilayer chip module.

19 Claims, 4 Drawing Sheets

METHOD OF MAKING AREA DIRECT TRANSFER MULTILAYER THIN FILM STRUCTURE

BACKGROUND OF THE INVENTION

1. Field of the Invention

This invention relates to a multilayer thin film structure and a process for manufacturing the structure and mounting it on an electronic packaging substrate.

2. Description of Related Art

An improvement in the method for producing multilayer thin film (MLTF) structures was disclosed in U.S. Pat. No. 5,258,236, assigned to the assignee of the present application, which involved building the MLTF structure as a "decal" on a transparent carrier. Between the MLTF structure and the carrier was a polyimide layer which served as a release layer to remove the MLTF structure from the carrier prior to joining it to a ceramic substrate. The release method disclosed was a laser ablation of the polyimide layer through the transparent substrate material. While the method of the '236 patent was successful in permitting simultaneous fabrication of the multilayer thin film interconnection structure and a ceramic substrate before the two are joined, it had the limitation that an external frame was required to be attached to the MLTF structure decal prior to release from the carrier on which it was formed. This led to a relatively cumbersome alignment and lamination process which involved high temperature adhesives. The framing of the decal and the process of the '236 patent also did not achieve high productivity in building the MLTF structure on the carrier since it required setting aside for handling purposes a frame area on each side of the individual MLTF decal sections, or "chicklets". This reduced the productive surface area on the carrier by up to 50%.

U.S. Pat. Nos. 4,480,288, 4,743,568, 4,950,527, 5,274,912, 5,286,335, and 5,329,695; and IBM TDB Vol. 21, No. 5, Vol. 27, No. 3, and Vol. 32, No. 5B disclose other manufacturing methods related to integrated circuit chips, some of which are also applicable to thin film structures. However, these references do not overcome the problems discussed above, or have other deficiencies which make them less desirable.

Bearing in mind the problems and deficiencies of the prior art, it is therefore an object of the present invention to provide a MLTF structure and method of fabrication which eliminates the need for additional framing and aligning equipment to join the MLTF structure to an electronic packaging substrate.

It is another object of the present invention to provide an improved MLTF manufacturing method which increases the yield on the carrier substrate on which it is formed.

A further object of the invention is to provide an improved method of transferring a MLTF structure to a substrate to form a single chip module (SCM) or multi-chip module (MCM).

It is yet another object of the present invention to provide a method of manufacturing and joining a MLTF structure to a substrate which increases productivity while reducing costs.

Still other objects and advantages of the invention will in part be obvious and will in part be apparent from the specification.

SUMMARY OF THE INVENTION

The above and other objects, which will be apparent to those skilled in the art, are achieved by the present invention which relates to a process for transferring a thin film wiring layer to a substrate in the construction of multilayer chip modules comprising providing a carrier having on a surface thereof, in the following order, i) a sacrificial release layer; and ii) a thin film structure comprising at least one dielectric material and at least one wiring path of electrically conductive material, at least a portion of the electrically conductive material being exposed on a surface of the thin film structure opposite the carrier. Also provided are a substrate and a joining composition on one or both of the exposed electrically conductive surface of the thin film structure or the substrate. The thin film structure is applied to the substrate so that the attached carrier is remote from the substrate, and the thin film structure and attached carrier are joined to the substrate. Finally, the release layer is contacted with an etchant for the release layer, the etchant being substantially inert to the dielectric layer and the electrically conductive layer of the thin film structure, so as to remove the carrier from the thin film structure to produce a SCM or MCM.

The preferred joining composition is solder, which is heated to join the thin film structure and attached carrier to the substrate.

In another aspect, the present invention relates to a process for transferring a thin film wiring layer to a substrate in the construction of multilayer chip modules comprising the steps of providing a carrier for constructing a multilevel thin film structure and depositing a sacrificial release layer on a surface of the carrier. Directly on the release layer there is then formed a multilevel thin film structure comprising at least one dielectric material and at least one wiring path of metallic material, at least a portion of the metallic material being exposed on a surface of the multilevel thin film structure opposite the carrier. A substrate is provided, and solder is applied to one or both of the exposed metallic surface of the multilevel thin film structure or the substrate. The multilevel thin film structure is then applied to the substrate so that the attached carrier is remote from the substrate. The solder is heated to join the multilevel thin film structure and attached carrier to the substrate. The release layer is subsequently contacted with an etchant for the release layer, the etchant being substantially inert to the dielectric layer and the metallic layer of the multilevel thin film structure, so as to remove the carrier from the multilevel thin film structure to produce a multilayer chip module.

Other electrically conductive joining materials can be used in place of solder, for example, electrically conductive filled epoxy or an electrically conductive polymer. Where epoxy or a polymer is used, it may be cured by processes other than heating.

In its preferred embodiment, the invention utilizes a large panel glass carrier substrate with a metallic release layer on which the MLTF structure is built and then transferred to any electronic packaging substrate with the carrier substrates still attached to the MLTF.

The process of the invention preferably forms the multilevel thin film structure as a thin film structure matrix covering substantially all of the area of the carrier. The process of may then include cutting the multilevel thin film structure and attached carrier into a plurality of multilevel thin film structures and attached carriers prior to joining the thin film structure to the substrate. In the course of positioning the thin film structure and attached carrier, the carrier portion may be held to facilitate handling.

The preferred release layer material is aluminum and the preferred etchant or solvent for the release layer is an alkali metal- or alkaline earth metal- hydroxide, such as sodium hydroxide. The etchant should be chosen so as not to damage the thin film structure applied to the release layer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
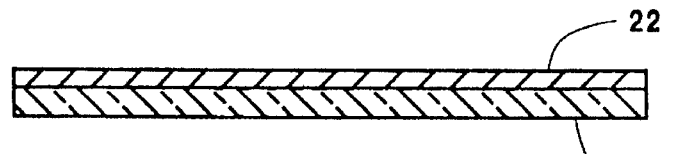
FIG. 1 is a side elevational view of a carrier and release layer employed in the present invention.

In describing the preferred embodiment of the present invention, reference will be made herein to FIGS. 1–15 of the drawings in which like numerals refer to like features of the invention. Features of the invention are not necessarily shown to scale in the drawings.

As shown in FIG. 1, initially there is a provided a substrate or carrier 20 made of any suitable material on which a multilayer thin film structure can be fabricated. The carrier may have any suitable diameter or dimension, for example, 125 mm or more on a side, typically 300–800 mm or larger on a side, and a suitable thickness, for example, 0.5 to 10 mm. The preferred carrier is a glass substrate.

Applied to one surface of the carrier 20 is a sacrificial release layer 22 which may be made of any material which can be etched, dissolved or otherwise removed from the MLTF structure to be fabricated without harming the MLTF structure. The release layer may be formed on all or only a portion of one surface of the carrier 20. The preferred release layer composition is a metal such as aluminum which may be sputter or vapor deposited as a film on carrier 20 by well known methods in the art. The preferred aluminum film layer is 2 micrometers in thickness.

Other release layer compositions which may be utilized include metals or other materials which have low residual stress. The release layer can comprise a plurality of layers of materials, one or more of which is a release material and other layers providing adhesion to the carrier and top of the MLTF. An example of a multilayer release layer is sequential layers of chromium/copper/chromium, where the copper acts as the release material and the chromium acts to adhere the copper to the carrier and MLTF. The release layers may have a thickness ranging from about 0.5 to 10 micrometers.

Figure 2:
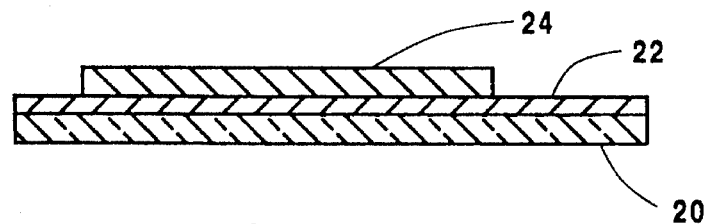
FIGS. 2–7 are side elevational views of a sequence of steps to build a multilayer thin film structure on the carrier and release layer employed in the present invention.

In FIG. 2 there is shown the initial sequence of one method of manufacturing the MLTF structure upon the release layer 22 of carrier 20. Initially a photoresist layer is applied and exposed to define the desired configuration of the terminal metal layer of the MLTF structure. In accordance with the present invention, the MLTF structure is constructed on the carrier in an "upside down" position so that the layer which will constitute the final top side of the completed chip is fabricated initially at the bottom as shown, adjacent to the carrier release layer 22. On the exposed area of the photoresist material there is electroplated a terminal metal layer 24 of thickness typically between 10 and 1000 nanometers. Terminal metal layer 24 may be, for example, chromium, copper or nickel, and may include other metals. Preferably the metal chosen will not dissolve in gold or copper, whichever is the metal of choice for the interconnect wiring. Terminal metallic layer 24 can also serve as an electrical ground plane for electrically testing the MLTF structure, following fabrication.

Figure 3:
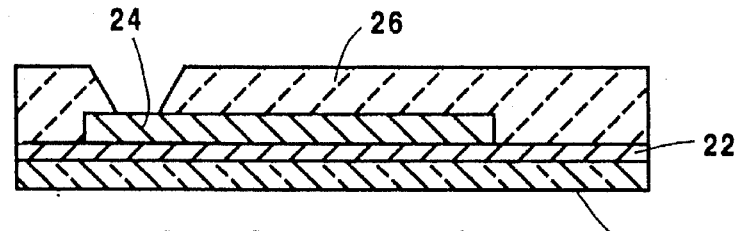
Figure 4:
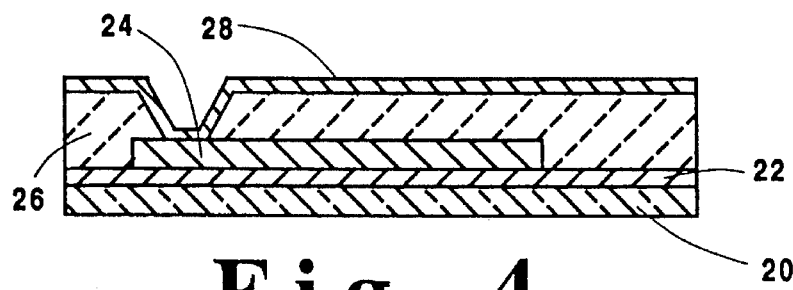
Figure 5:
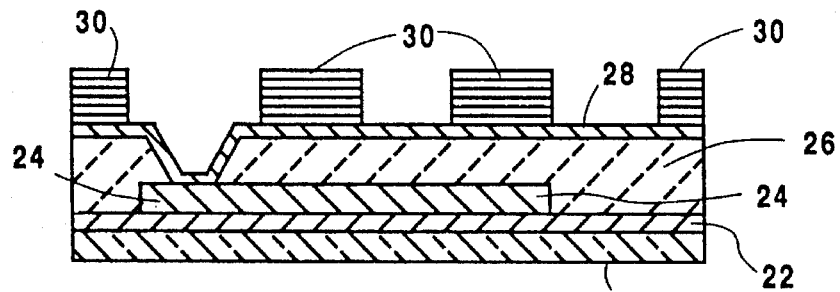
Figure 6:
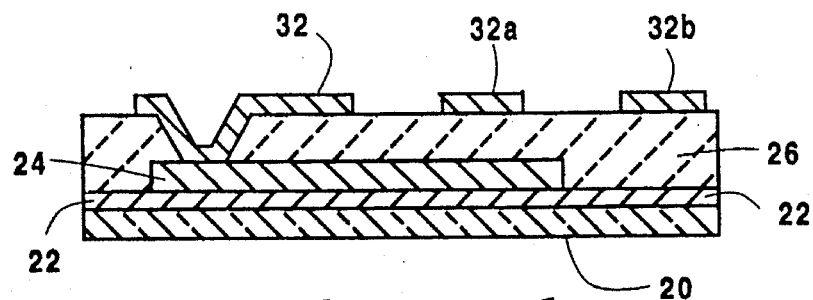
Figure 7:
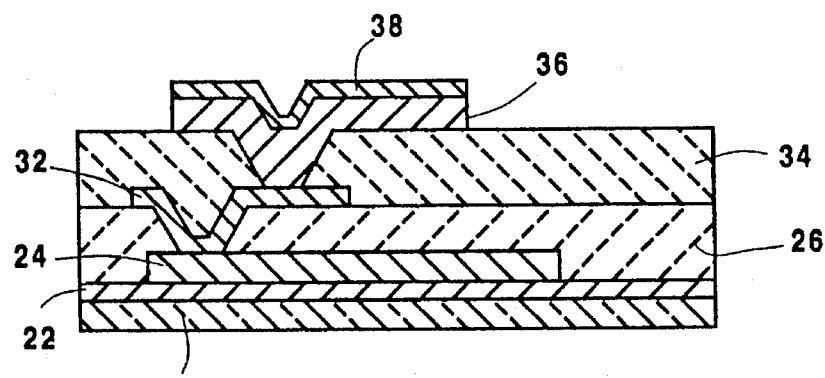

The next step, as shown in FIG. 3, is to apply and pattern the vias in a dielectric layer 26. Preferred dielectric materials include polyimides, epoxies and benzocyclobutene (sold by Dow Chemical Co. under the tradename CYCLOTENE®), or other high temperature polymer compositions. The steps for forming the MLTF structure are those otherwise conventionally utilized in the art, such as wet and dry processes. These include applying a metallic layer 28, for example, by sputtering a chromium/copper seed layer (FIG. 4), applying a photoresist material 30 to define a wiring level (FIG. 5), and electroplating a wiring metal such as copper or other desired electrically conductive material 32, 32a and 32b (FIG. 6). The photoresist material is then stripped and the metallic wiring layer 32 is contacted with a suitable etchant.

The fabrication of the MLTF structure is then continued in the manner described in FIGS. 3–6 until completed. This may include the addition of one or more dielectric layer 34 and metallic wiring layer 36 as shown by way of example in FIG. 7 to form a plurality of thin film wiring layers. Copper or aluminum may be used for the wiring, as long as it is substantially inert to the releasing agent used to remove release layer 22. The present invention may utilize a one seed/electro deposition step and one flash etch step for the entire MLTF build.

The methods of building the MLTF on the sacrificial release layer shown in the drawings are given by way of example. Other methods known in the art may be employed to construct the MLTF.

In accordance with one embodiment of the present invention, there may be applied a layer of a joining composition 38 such as a suitable lead-tin solder to the last metallic layer of the MLTF structure, such as metallic layer 36. The "last" layer as formed on carrier 20 is actually the lowest layer of the MLTF structure as it will be applied later to the substrate in producing the SCM or MCM. The purpose of the joining layer 38 is to connect the MLTF structure physically and/or electrically to the substrate. Other electrically conductive joining materials can be used in place of solder, for example, electrically conductive filled epoxy.

Figure 8:
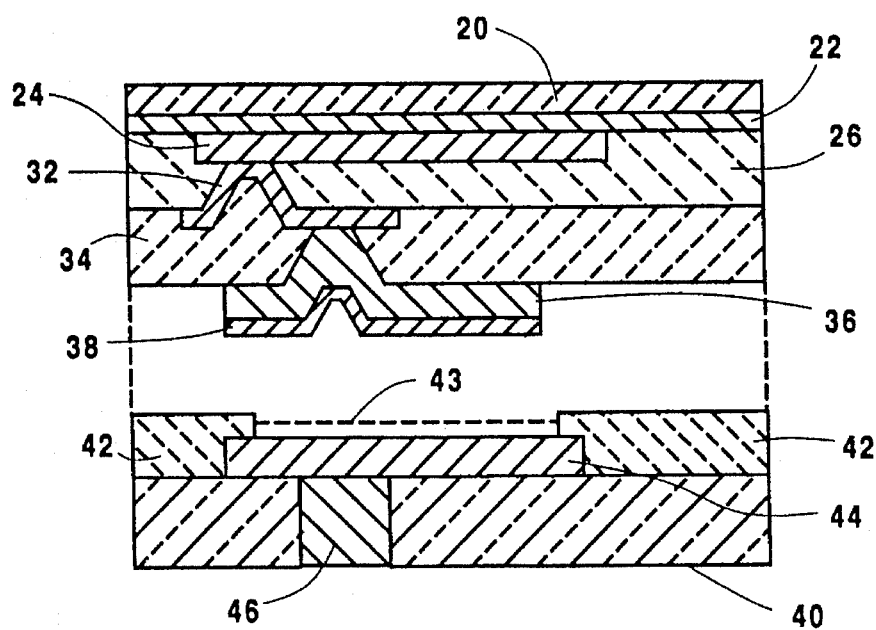
FIG. 8 is a side elevational view of the placement of a multilayer thin film structure, formed on a carrier and release layer, over a substrate according to the present invention.
Figure 9:
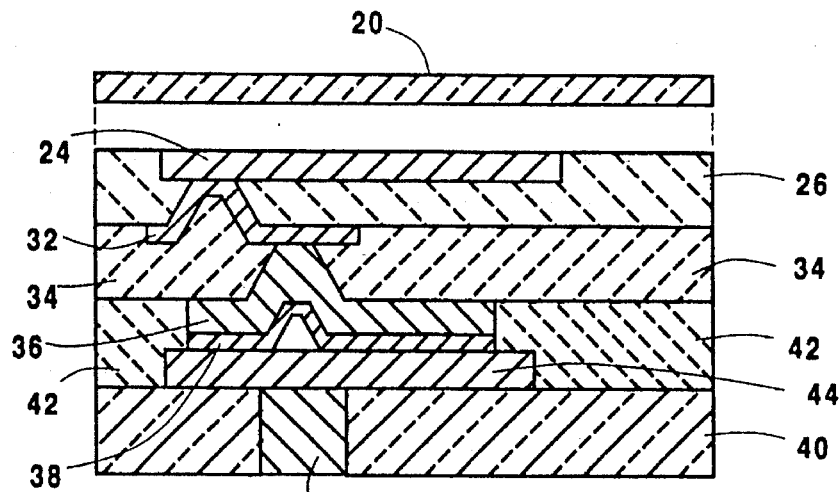
FIG. 9 is a side elevational view of the joining of a multilayer thin film structure to a substrate and the separation of a carrier layer according to the present invention.

As shown in FIG. 8, the MLTF structure as formed on the release layer and carrier is inverted and positioned over the desired position for mounting on substrate 40. On the substrate a capture pad comprises a metallic layer 44 within a dielectric layer 42. The capture pad metallic layer 44 may electrically connected to an underlying structure (not shown) by via 46. The substrate 40 employed with the MLTF structure to form the SCM or MCM can be any metallic or non-metallic material, such as a conductive or non-conductive ceramic or glass substrate, a printed wiring board, plastic card, silicon, aluminum-nitride, diamond, or any other rigid substrate.

The inverted MLTF structure is then placed down and in contact with the capture pad area of the substrate 40. The MLTF structure, as still attached to the carrier 20 and release layer 22, is then adhered and joined to the substrate capture pad, for example, by heating the solder to above its melting point and then solidifying the layer to provide mechanical and electrical connection. Where epoxy or a polymer is used as the joining material, the MLTF structure should be placed in contact with the capture pad area prior to curing of the epoxy or polymer. The epoxy or polymer may be cured by heating or by conventional processes other than heating.

As an alternative to the methods described above, another embodiment of the present invention provides that the capture pad metallic layer 44 may include a layer of solder or other joining composition 43, as shown in phantom lines in FIG. 8. This joining composition layer 43 may be provided in addition to the joining composition 38 on the MLTF structure, or instead of joining composition layer 38.

Following the joining of the MLTF structure to the substrate, release layer 22 is then exposed to an etchant. As used herein, "etchant" include etchants, solvents or other means for dissolving and/or removing the release layer. For the preferred embodiment utilizing an aluminum film release layer, the etchant is an aqueous solution of an alkali metal- or alkaline earth metal- hydroxide, such as sodium hydroxide. The etchant should be selected so that the MLTF structure is not damaged by contact therewith. Exposure to the removing means should be continued until the carrier 20 is released, and the release layer 22 is completely removed, from the MLTF structure. The carrier itself is preferably substantially inert to the removing means.

Figure 10:
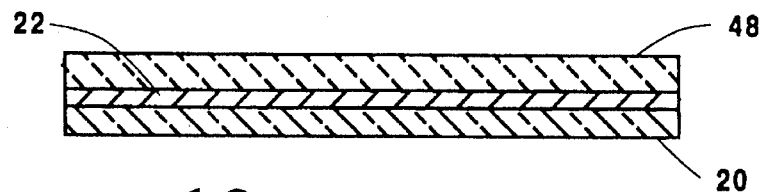
FIGS. 10–12 are side elevational views of an alternate sequence of steps to build a multilayer thin film structure on the carrier and release layer employed in the present invention.
Figure 11:
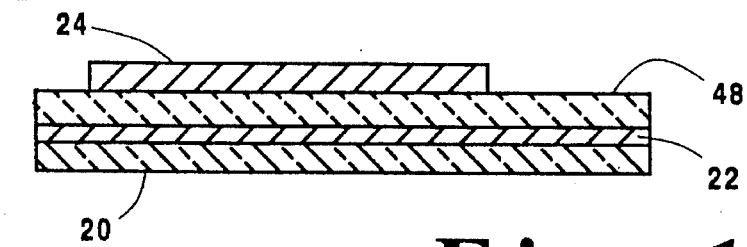
Figure 12:
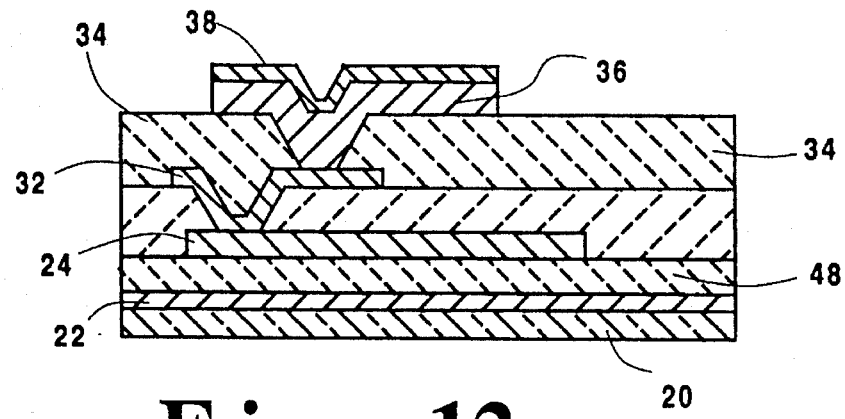
Figure 13:
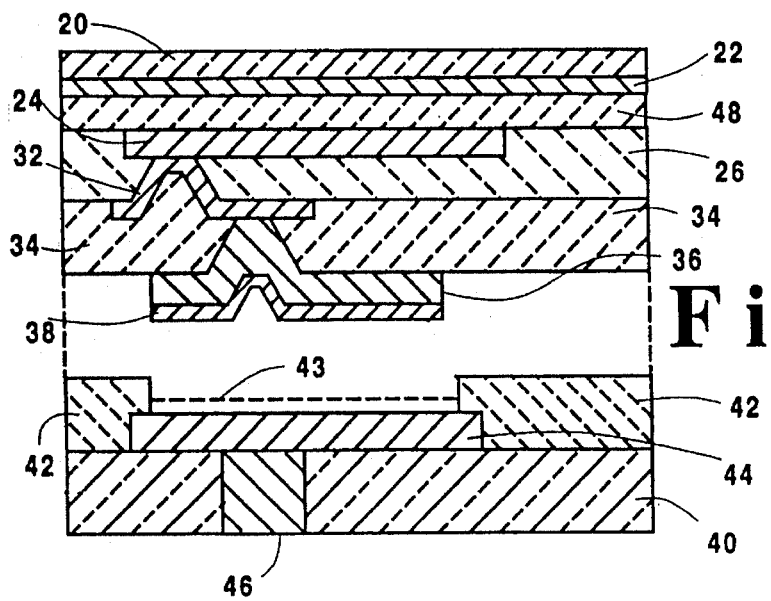
FIG. 13 is a side elevational view of the placement of an alternate multilayer thin film structure, formed on a carrier and release layer, over a substrate according to the present invention.
Figure 14:
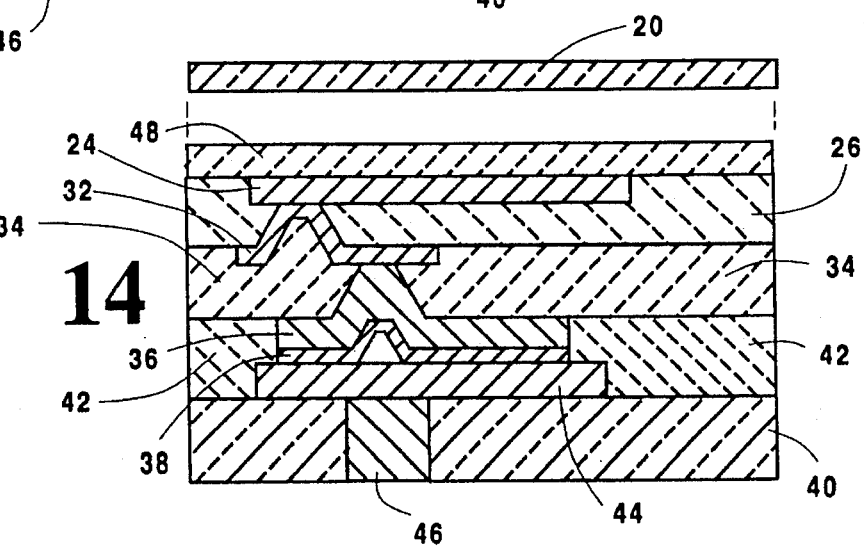
FIG. 14 is a side elevational view of the joining of an alternate multilayer thin film structure to a substrate and the separation of a carrier layer according to the present invention.
Figure 15:
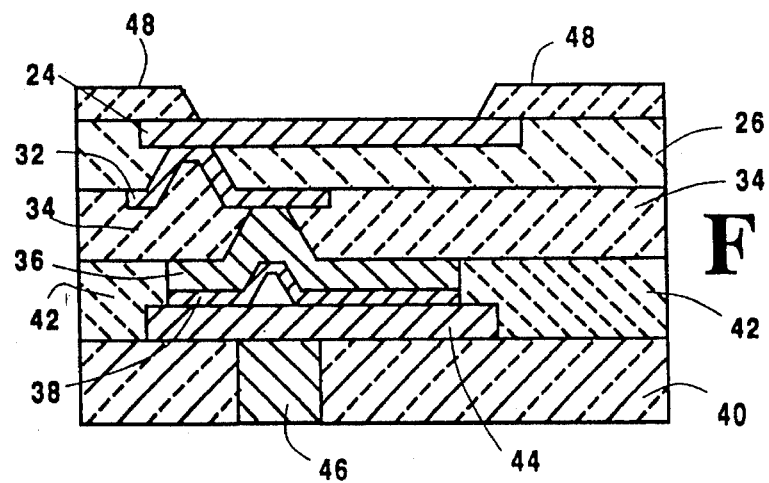
FIG. 15 is a side elevational view of the removal of a portion of a dielectric layer on an alternate multilayer thin film structure transferred according to the present invention.

FIGS. 10–15 illustrate another method of building the MLTF on the sacrificial release layer on the carrier. In FIG. 10, a dielectric layer 48, such as a polyimide, is initially formed on release layer 22, rather than forming the terminal metal layer directly on the release layer as shown in FIG. 2. Instead, terminal metal layer 24 is formed on dielectric layer 48, as shown in FIG. 11. The process is continued as described previously until the MLTF build is complete (FIG. 12). The MLTF—carrier assembly is inverted over electronic substrate 40 (FIG. 13) and applied to the capture pad area of the electronic substrate, where release layer 22 is then etched away and carrier 20 is released (FIG. 14). Finally, dielectric layer 48 is treated to fully or partially remove it and expose terminal metal layer 24 (FIG. 15).

In the preferred embodiment of the present invention, the MLTF structure is constructed as a matrix on a large area carrier 20 so that it can be sectioned or "diced" into a plurality of separate sections or "chicklets" prior to joining with substrate 40. The thin film structure can cover substantially all of the area of the carrier as initially fabricated. No framing areas are required to be used between or around the areas of the individual MLTF sections to be diced from the initial large area matrix, and the thin film structure can extend to the edges of the individual diced sections. Because rigid carrier 20 is still attached to the MLTF structure, it provides an integral structure for holding gripping the MLTF structure during subsequent positioning and joining to the substrate. As such, the present invention eliminates the need to use complex framing and alignment equipment in the joining process.

The MLTF structure can be individually tested prior to joining with the substrate 40. Such testing may be done by a known methods, such as those employed in the aforementioned '236 patent, the disclosure of which is hereby incorporated by reference.

EXAMPLE I

To demonstrate the release process employed in the present invention, a 2 micrometer thick layer of aluminum film was sputter deposited on a glass substrate carrier of 127 mm on a side. A 12 micrometer thick layer of DuPont 5811 polyimide was spun coated onto the release layer and cured at 400° C. Four (4) 50 mm×50 mm squares were defined by ablating the polyimide layer, simulating the dicing operation where the edges of the aluminum release layer are exposed. The polyimide film was released from the glass carrier by immersing the substrate in 12% NaOH solution at 40° C. for 5 to 8 minutes. No aluminum was left remaining on the polyimide.

EXAMPLE II

To demonstrate the transfer process employed in the present invention, a 12 micrometer thick layer of DuPont 5811 polyimide was spun coated and cured at 400° C. on a glass carrier of 127.5 mm×127.5 mm. To simulate a MLTF structure, a chromium/copper seed layer was applied to the polyimide layer, and to the seed layer was electroplated successive layers of 5 micrometer thick copper, 2 micrometer thick nickel and 1500 angstrom thick gold. Finally, a 25 micrometer thick layer of solder comprising 97% by weight lead and 3% by weight tin was deposited on the gold-plated surface.

The carrier was then cut into 4 equal sections. One section of the carrier was then inverted and applied to a ceramic substrate which had been metallized with successive layers of chromium, copper, nickel and gold. Joining was effected by heating to 340° C. to melt the solder layer, and subsequently cooling the assembly. With the carrier still attached, the underside of the polyimide was released from the carrier by ablating through the glass by an excimer laser at 308 nanometers, leaving the MLTF structure joined to the ceramic substrate.

The invention as described achieves the objects described heretofore and allows for maximum utilization of the carrier active area by eliminating the framing required to hold the MLTF structure during the transfer operation to the substrate.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A process for transferring a film wiring layer to a substrate in the construction of single or multilayer chip modules comprising the steps of:
   a) providing a carrier for constructing a multilevel film structure;
   b) depositing at least one sacrificial release layer on a surface of the carrier;
   c) forming on the release layer a multilevel film structure comprising at least one dielectric material and at least one wiring path of metallic material, at least a portion of the metallic material being exposed on a surface of the multilevel film structure opposite the carrier;
   d) providing a substrate;
   e) applying solder to one or both of the exposed metallic surface of the multilevel film structure and the substrate;
   f) applying the multilevel film structure to the substrate so that the attached carrier is remote from the substrate;
   g) heating the solder to join the multilevel film structure and attached carrier to the substrate; and
   h) contacting the release layer with an etchant for the release layer, said etchant being substantially inert to the dielectric layer and the metallic layer of the multilevel film structure, so as to remove the carrier from the multilevel film structure to produce a multilayer chip module.

2. The process of claim 1 wherein said release layer comprises a metal.

3. The process of claim 2 wherein said etchant is essentially inert to the multilevel film structure.

4. The process of claim 1 wherein said release layer comprises aluminum.

5. The process of claim 1 wherein said release layer comprises copper or a copper alloy.

6. The process of claim 1 further including, between steps (c) and (f), the steps of:
   cutting the multilevel film structure and attached carrier into a plurality of multilevel film structures and attached carriers; and
   proceeding with steps (f) through (h) for said plurality of multilevel film structures and attached carriers.

7. The process of claim 1 wherein the step (c) forming of the multilevel film structure comprising a film structure matrix covering substantially all of the area of the carrier.

8. A process for transferring a film wiring layer to a substrate in the construction of multilayer chip modules comprising the steps of:
   a) providing a carrier having on a surface thereof, in the following order, i) a sacrificial release layer; and ii) a film structure comprising at least one dielectric material and at least one wiring path of electrically conductive material, at least a portion of the electrically conductive material being exposed on a surface of the film structure opposite the carrier;
   b) providing a substrate;
   c) providing a joining composition on one or both of the exposed electrically conductive surface of the film structure and the substrate;
   d) applying the film structure to the substrate so that the attached carrier is remote from the substrate;
   e) joining the film structure and attached carrier to the substrate; and
   f) contacting the release layer with an etchant for the release layer, said etchant being substantially inert to the dielectric layer and the electrically conductive layer of the film structure, so as to remove the carrier from the film structure to produce a chip module.

9. The process of claim 8 wherein the joining composition is solder, and step (e) comprises heating the solder.

10. The process of claim 8 wherein the joining composition is an electrically conductive epoxy or an electrically conductive polymer.

11. The process of claim 8 wherein the sacrificial release layer comprises a metal.

12. The process of claim 11 wherein said release layer comprises aluminum.

13. The process of claim 11 wherein said release layer comprises copper or a copper alloy.

14. A process for transferring a film wiring layer to a substrate in the construction of multilayer chip modules comprising the steps of:
   a) providing a carrier having on a surface thereof, in the following order, i) a sacrificial release layer; and ii) a film structure comprising at least one dielectric material and at least one wiring path of electrically conductive material, at least a portion of the electrically conductive material being exposed on a surface of the film structure opposite the carrier, said film structure being in the form of a matrix which may be sectioned into a plurality of individual film and carrier structures;
   b) providing a substrate;
   c) providing a joining composition on one or both of the exposed electrically conductive surface of the film structure and the substrate;
   d) sectioning the film matrix and the carrier into a plurality of individual film and carrier sections;
   e) holding a carrier section and applying the film structure to the substrate so that the attached carrier is remote from the substrate;
   f) joining the film structure and attached carrier to the substrate; and
   g) contacting the release layer with a solvent for the release layer, said solvent being substantially inert to the dielectric layer and the electrically conductive layer of the film structure, so as to remove the carrier from the film structure to produce a chip module.

15. The process of claim 14 wherein the film structure extends substantially to the edge on the individual film and carrier sections.

16. The process of claim 14 wherein the film structure matrix covers substantially all of the area of the carrier.

17. The process of claim 14 wherein the sacrificial release layer comprises a metal.

18. The process of claim 17 wherein said release layer comprises aluminum.

19. The process of claim 17 wherein said release layer comprises copper or a copper alloy.

* * * * *